United States Patent [19]

Oshida et al.

[11] Patent Number: 5,392,115
[45] Date of Patent: * Feb. 21, 1995

[54] METHOD OF DETECTING INCLINATION OF A SPECIMEN AND A PROJECTION EXPOSURE DEVICE AS WELL AS METHOD OF DETECTING PERIOD OF PERIODICALLY VARYING SIGNAL

[75] Inventors: Yoshitada Oshida, Fujisawa; Taku Ninomiya; Toshiei Kurosaki, both of Katsuta, all of Japan

[73] Assignee: Hitachi, Ltd., Tokyo, Japan

[*] Notice: The portion of the term of this patent subsequent to Jul. 13, 2010 has been disclaimed.

[21] Appl. No.: 936,661

[22] Filed: Aug. 28, 1992

Related U.S. Application Data

[63] Continuation-in-part of Ser. No. 623,438, Dec. 14, 1990, Pat. No. 5,227,862, and Ser. No. 641,935, Jan. 16, 1991, abandoned.

[30] Foreign Application Priority Data

Aug. 29, 1991 [JP] Japan .................. 3-218259

[51] Int. Cl.⁶ .............................................. G01B 9/02
[52] U.S. Cl. ...................................... 356/349; 356/358; 356/363; 356/401
[58] Field of Search ............... 356/345, 349, 351, 358, 356/363, 401; 250/572

[56] References Cited

U.S. PATENT DOCUMENTS 5,227,862 7/1993 Oshida et al. ........................ 356/363

Primary Examiner—Samuel A. Turner
Attorney, Agent, or Firm—Antonelli, Terry, Stout & Kraus

[57] ABSTRACT

A method for detecting a period of a periodically varying signal and/or an inclination of a specimen utilizing an exposure apparatus wherein a coherent light is divided into first and second lights and the first light is irradiated onto the specimen at a predetermined angle, and a reflected light thereof and a reference light as the second light interfere with each other so as to form interference fringes, the interference fringes are detected, and the inclination of the specimen is detected from a pitch representing a period of the interference fringes. The method includes detecting a spectrum of a signal intensity obtained from the detected interference fringes or the periodically varying signal, subjecting the detected spectrum data to a fast complex Fourier transformation, calculating a true spectrum peak position $j_R$ in accordance with a relationship $j_R = j_0 + \Delta$, where $j_0$ is a detected spectrum peak position and $\Delta$ is a correcting value estimated from the Fourier transformed spectrum data adjacent to $j_0$, and calculating the pitch P of the period of the signal intensity information in accordance with a relationship $P = N/j_R$, where N is the number of sample data points for the complex Fourier transformation. Further, the method includes calculating the inclination of the specimen from the pitch P.

9 Claims, 10 Drawing Sheets

METHOD OF DETECTING INCLINATION OF A SPECIMEN AND A PROJECTION EXPOSURE DEVICE AS WELL AS METHOD OF DETECTING PERIOD OF PERIODICALLY VARYING SIGNAL

CROSS-REFERENCE TO RELATED APPLICATIONS

The present invention is a continuation-in-part application of U.S. application Ser. No. 623,438, filed Dec. 14, 1990, now U.S. Pat. 5,227,862, the subject matter of which is incorporated by reference herein and of U.S. application Ser. No. 641,935, filed Jan. 16, 1991, and now abandoned, the subject matter of which is incorporated by reference herein.

FIELD OF THE INVENTION

The present invention relates to detection or measurement of an inclination of a specimen in various fields using frequency analysis, spectrum analysis or light interference in a measuring field, a projection exposure device utilizing the same, and a method of detecting a period of a periodically varying signal in the measuring field. More specifically, the present invention relates to a projection exposure device for exposing a semiconductor circuit pattern having line width of 0.5 $\mu$m or less.

BACKGROUND OF THE INVENTION

Referring to copending U.S. application Ser. No. 623,438, when a fundamental frequency of a periodically varying signal is substantially determined and is varied in time or in space, it is required in various measuring fields that the fundamental frequency be exactly estimated every moment or in each location within the space utilizing an interference fringe. Such a periodic signal is a continuous analog signal originally, but in order to perform the signal processing exactly at high speed, the signal is read discretely at definite sampling points and is digitized and processed. Calculation of the above-mentioned fundamental frequency is also performed in such discrete reading and digitizing, and fast Fourier transformation (FFT) is widely used in this case. When the periodically varying signal is read at regular intervals of sampling points and the data are used as an input and complex fast Fourier transformation is performed, if the input signal is plus or positive, for example, and is composed of a fundamental frequency which is substantially constant, data as FFT results obtained discretely have the maximum of the absolute values on positions corresponding to the fundamental frequency. Since the results of FFT are discrete, in order to estimate the fundamental frequency exactly, estimation of the sampling points providing the maximum value appearing only in the neighborhood of the fundamental value is quite insufficient. Therefore, in copending U.S. application Ser. No. 623,438, data in the sampling point $j_0$ to provide the maximum value and both sampling points $j_0-1$, $j_0+1$ adjacent to $j_0$, that is, three pieces of data in total, are used, and interpolation application close to secondary approximation is performed and the interpolation spectral peak position $J_0+\Delta'$ ($|\Delta'|\leq 0.5$) is estimated.

In the aforedescribed method, when the fundamental frequency exists in the neighborhood of the sampling points, the fundamental frequency can be estimated exactly, by the secondary approximation of data at the three sampling points, $J_0-1$, $j_0$, $j_0+1$, but when the fundamental frequency comes near an intermediate point between the two neighboring sampling points, significant error is produced. The greater the noise component of low frequency or high frequency other than the fundamental frequency component, the greater the error. Consequently, it becomes difficult to estimate the measured value from the fundamental frequency exactly.

SUMMARY OF THE INVENTION

It is an object of the present invention to provide a method of detecting an inclination of a specimen utilizing an interference fringe.

It is another object of the present invention to provide a method of detecting an inclination of a specimen utilizing an interference fringe, where even if the fundamental frequency comes near an intermediate point between two neighboring sampling points, an error is not produced, but the fundamental frequency is measured exactly and inclination of a specimen is estimated exactly.

It is a further object of the present invention to provide a projection exposure device which enables measuring of a fundamental frequency and inclination of a specimen and where even if the fundamental frequency comes near an intermediate point between the two neighboring points, an error is not produced, but the fundamental frequency is measured exactly and the inclination of a specimen is estimated exactly, and surface of a substrate exposed per each exposure domain is matched with a focusing surface.

It is another object of the present invention to provide a method and apparatus for detecting a period of a periodically varying signal and where even if the fundamental frequency comes near an intermediate point between the two neighboring points, an error is not produced but the fundamental frequency can be detected exactly.

In accordance with the present invention, approximation accuracy becomes very high when a fundamental frequency comes near an intermediate point between the two neighboring sampling points. That is, spectral data are estimated at the sampling point $j_0$ to provide the maximum value in sampling points in the neighborhood of spectrum corresponding to the period of the signal and at the sampling point to give the large value being second to the maximum value among the sampling points $j_0+1$ and $j_0-1$ adjacent to the point $j_0$, that is, at the two points in total, and interpolation spectral peak position $j_0+\Delta''$ ($|\Delta''|\leq 0.5$) is estimated from the spectral data, and previous $\Delta'$ and new $\Delta''$ as described here are used, thereby the exact or true spectral peak position $j_R=j_0+\Delta$, where ($|\Delta|\leq 0.5$) is estimated, and the period or pitch of a periodically varying signal is exactly detected from the value of $j_0+\Delta$. How to estimate $\Delta$ will be explained as follows. The above-mentioned $\Delta$ is subjected to the weighting by $G_1(\Delta')$ which is a function of $\Delta'$, and $\Delta''$ is subjected to the weighting by $G_2(\Delta'')$ which is a function of $\Delta''$, and the weighted mean indicated by following formula is performed.

$$\Delta=(\Delta'\times G_1(\Delta')+\Delta''\times G_2(\Delta''))/(G_1(\Delta')+G_2(\Delta''))$$

The period or pitch of a periodically varying signal is exactly detected from the weighted mean $\Delta$. Since $\Delta''$ can be estimated exactly when it has a value near 0, the weighting function $G_2(\Delta'')$ as above described is made a function of $|\Delta''|-0.5$, and since $\Delta'$ can be estimated exactly when it has a value near 0.5, the weighting function $G_1(\Delta')$ as above described is made a function of $\Delta'$, and $\Delta$ is estimated based on the above formula so that the exact spectral peak position $j_0 + \Delta$ ($|\Delta| \leq 0.5$) is estimated.

The weighting function $G_2(\Delta'')$ is a function of $\Delta''$, but is made a function of $|\Delta''|-0.5$ so that $G_2(\Delta'')$ becomes 0 when $|\Delta''|=0.5$. On the other hand, $G_1(\Delta')$ is made a function of $\Delta'$ so that $G_1(\Delta')$ becomes 0 when $\Delta'=0$. These weighting functions $G_1(\Delta')$, $G_2(\Delta'')$ are used and $\Delta$ is estimated by $\Delta = (\Delta' \times G_1(\Delta') + \Delta'' \times G_2(\Delta''))/(G_1(\Delta') + G_2(\Delta''))$, thereby at the position where respective errors of $\Delta'$, $\Delta''$ become large, the weighting functions $G_1(\Delta')$, $G_2(\Delta'')$ become small respectively, and an error is prevented from being produced and the exact spectral peak position can be always estimated irrespective of the peak value of spectrum so that measuring with high accuracy can be realized.

These and further objects, features and advantages of the present invention will become more obvious from the following description when taken in connection with the accompanying drawings which show for purposes of illustration only, several embodiments in accordance with the present invention.

DESCRIPTION OF THE PREFERRED EMBODIMENTS

Figure 1:
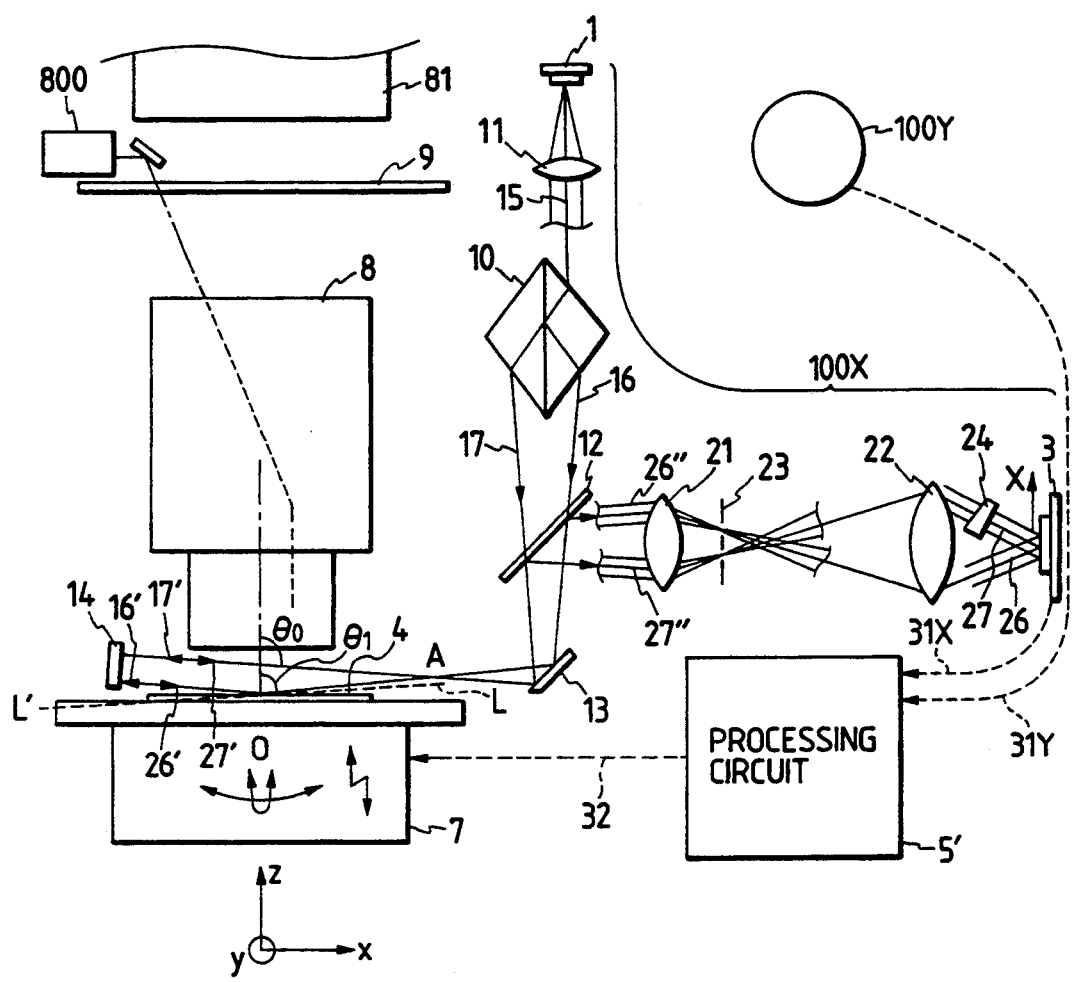
FIG. 1 is a block diagram for explaining a method of detecting a period of a periodically varying signal and a method of detecting inclination of a specimen using a projection exposure device in accordance with the present invention.

FIG. 1 shows apparatus for detecting an inclination of a specimen using a method of detecting exactly a period of a periodically varying signal according to the present invention, and a projection exposure device using the detecting method. An exposure light ray emitted from an exposure light illumination system 81 illuminates a reticle 9, and the light transmitted therethrough is projected as a compressed image of a pattern of the reticle on the surface of a wafer 4 on a stage 7 through a reduction (compression) projection lens 8. Relative positions of the reticle 9 and the wafer 4 are detected by an alignment system 800, and a superposed exposure of a pattern is effected by fine control of the reticle 9 or the wafer 4. 100X designates a system for detecting the inclination and height on the X direction. A similar optical system is also provided, though not shown, for the inclination in Y direction. The detection system will be explained below.

The light emitted from a coherent light source 1 such as a semiconductor laser is converted into parallel beams 15 by a lens 11. The parallel beams 15 are separated into parallel beams 16 and 17 by a beam splitter prism 10. The parallel beams 16 are irradiated at an incident angle $\theta$ (e.g., 88 degrees) on a photoresist on the uppermost surface of the wafer 4 which is an Si wafer providing an object to be exposed on the stage 7 having mounted thereon a vertical two-axis gate mechanism through a beam splitter 12 and a mirror 13 making up an illumination arrangement. As described above, almost all the light is reflected on the surface of the photoresist and the reflected object light 16' enters a reflecting plane mirror 14 providing a return detection optical system from the perpendicular direction, and proceeding along the original light path in the opposite direction, is reflected on the wafer 4, and further through the mirror 13, the beam splitter 12, a lens 21, a pinhole plate 23 and a lens 22, reaches a pattern detection unit 3 in the form of a CCD unit as an object light 26''. A reference light 17 separated by the beam splitter 10, on the other hand, proceeds in the same direction along substantially the same light path as the irradiated light 16 (strictly, along the direction at an angle of e.g., 90 degree to the wafer normal), is reflected in a perpendicular direction on the plane mirror 14, proceeds as a reference light 27'' along substantially the same route as the object light 26'', and reaches the CCD pattern detection unit 3 through a wedge glass 24. The path of the reference light is different from the object light path in that the former light is not reflected on the object of exposure 4 but passes through the wedge glass 24. The lenses 21 and 22 have the incident parallel beams emitted therefrom in the form of parallel beams, and cause an image to be formed substantially on the pattern detector of the position of irradiation of the irradiated light, that is, an exposure area 0 on the wafer. Now, assume that there is no wedge glass provided, and the intersection A of the objective light and the reference light returned by reflection on the wafer has an image thereof formed rearward of the light-receiving surface of the pattern detection means. This indicates that the two light beams are displaced on the light receiving surface. To cope with this, a wedge glass is inserted in the reference light (or object light) to enable the two beams to cross on the light-receiving surface and form an image of the exposure area 0. The pinhole plate 23 arranged in the return detection optical system is located at the convergence point of the objective light and the reference light which are parallel beams entering the lens 21, with a very small opening at the convergence point. This pinhole plate eliminates the back reflected light generated in the lens or pattern detection means which is the problem in using a laser beam of high coherency, and thus prevents a noise beam from being superposed on the light-receiving surface of the pattern detection means. The interference fringe detected at the CCD pattern detection unit 3 has a intensity distribution Ix shown in FIG. 2. The pattern detection unit 3 is a one-dimensional CCD array sensor, and the intensity value is determined by the position marked on the X axis in FIG. 2. This data is transmitted to the processing circuit 5'.

The semiconductor exposure device exposes a number of chips having a circuit line width pattern of 0.5 μm or less on an Si wafer 4 in step-and- repeat manner at high speed. When the circuit line width becomes 0.5 μm or less, a focal depth of an image of the reticle 9 with an original picture of five times of the circuit pattern drawn thereon by a reducing lens 8 becomes 0.5 μm or less. If the line width further becomes as small as 0.3 μm, the focal depth becomes 0.5 μm or less. In the whole exposure domain of 20 mm square or more on the wafer being exposed by the exposure shot of one time, the wafer surface and the image surface must be coincident within the focal depth. However, since the wafer surface itself is wavy or the surface of the drawing pattern has unevenness, that it is not flat, and also since the image surface of the reducing lens 8 is not completely flat, in the exposure domain on the wafer, for example, in the inside of 20 mm square, an inclination of $\pm 0.2$ μm ($\pm 10^{-5}$ rad) is not allowed. In order to match the inclination of the wafer with the image surface exactly, the wafer stage 7 is driven in step-and-repeat manner, and in every exposure, an inclination of the wafer is exactly measured by the inclination detectors 100X and 100Y and deviation from the correct inclination value is estimated and an inclination mechanism of the wafer stage 7 is driven, so that the fine pattern can be exposed with high resolution in the entire exposure domain.

The inclination detector 100X has a function that a laser light emitted from a laser light source 1 is made a desired beam diameter by the collimator lens 11 and is divided in two by the beam splitter 10. One of the divided beams is made a detection light 16 to be irradiated to the wafer, and the other beam is made a reference light 17 for generating interference fringes. Both lights pass through optical paths which are close to each other by way of the mirror 13, and are reflected by the mirror 14 and returned to the original optical paths again. The returned lights are led to detection light paths by the beam splitter 12. The object light 26" and the reference light 27" which are reflected and returned by the wafer pass through lenses 21, 22 and a pinhole plate 23 and then overlap each other on the CCD detector 3 whereat an intensity of the interference fringes is detected.

Figure 2:
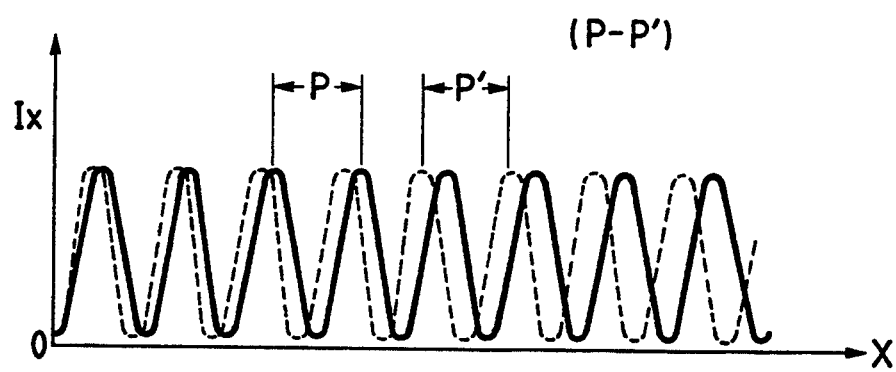
FIG. 2 is a diagram showing a variation of interference fringes accompanying a variation of inclination in accordance with the detection of inclination of a specimen.
Figure 3:
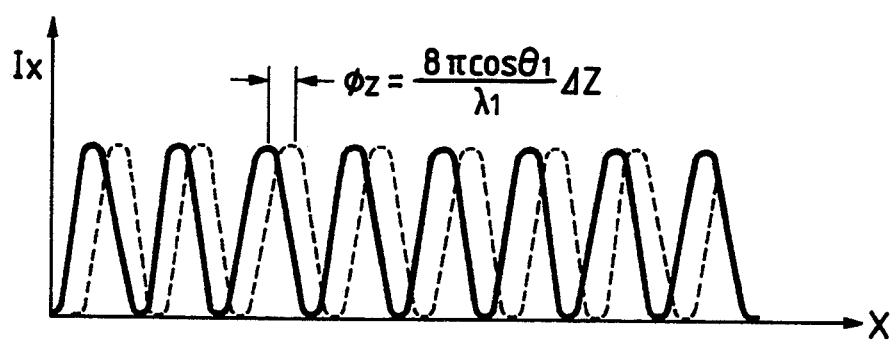
FIG. 3 is a diagram showing a variation of interference fringes accompanying a variation of height in the detection of inclination of a specimen.

If the wafer is inclined as represented by the line LL' of FIG. 1, as shown in FIG. 2, interference fringes are varied from a state as shown in dotted line to state of solid line, and as a result, a pitch of the interference fringes is varied from P' to P. Also if a height of the wafer is varied, as shown in FIG. 3, a phase of the interference fringes is varied. Consequently, if the pitch and the phase are estimated based on the intensity signal of the detected interference fringes, a difference from the pitch and the phase corresponding to inclination and height to attain the best focus can be estimated in the whole surface of the exposure domain, and this value is made the drive amount from the present value and the inclination and the height of the stage may be driven.

Figure 4:
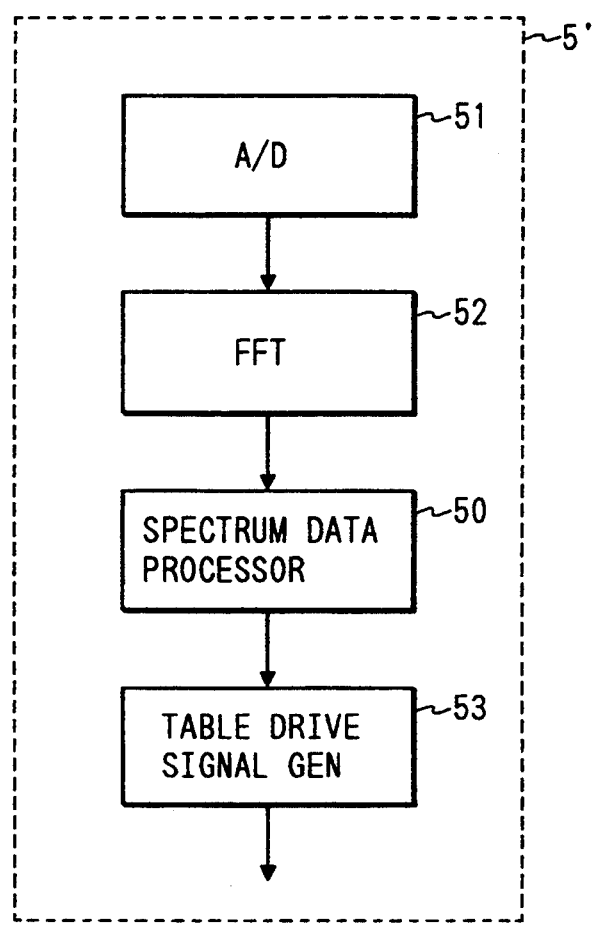
FIG. 4 is a block diagram of an apparatus for estimating pitch and phase of interference fringes from the intensity signal of the interference fringes in accordance with the present invention.
Figure 5:
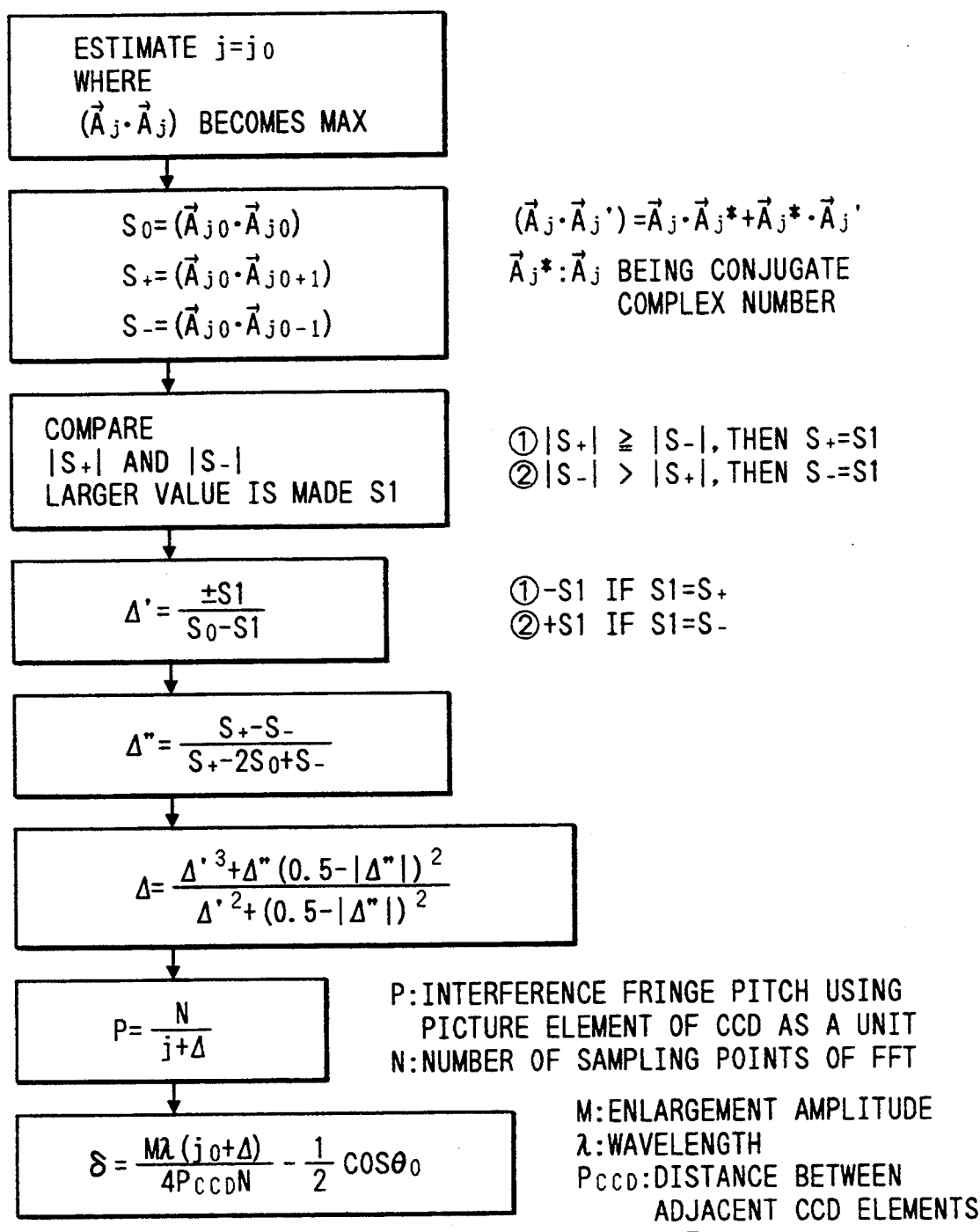
FIG. 5 is a flowchart for estimating pitch and inclination in a spectral data processing circuit in accordance with the present invention.

FIG. 4 shows the construction of the processing circuit 5' for estimating pitch and phase of the interference fringes from the intensity signal of the interference fringes. The object light and the reference light being reflected by the wafer and returned to the CCD are in Gaussian distribution, but the pitch and the phase at the interference fringes represent the inclination and the height of the wafer as above described. The discrete intensity signals at the n-th power of 2 in number obtained from each element of a CCD are made digital signals by an A/D converter 51, and the discrete digital signals are inputted to an FFT (fast Fourier transformation) circuit 52 and the Fourier transformation is executed. Since the spectrum is obtained as discrete data of the n-th power of 2 in number, the pitch is first estimated from the data described below. As shown in FIG. 4, a spectral data processing circuit 50 for estimating pitch and phase based on the discrete data of the n-th power of 2 in number obtained as a result of the Fourier transformation is provided, and details of the method of estimating the pitch among the spectral data processing circuit are shown in the flowchart of FIG. 5.

Input signals of the FFT are real numbers, but are subjected to complex Fourier transformation. Data obtained as this result become discrete complex data of the n-th power of 2 in number. Among the complex data from the first one to the n-th power of 2, the i-th one is designated by Aj. Among Aj of the n-th power of 2 in number, an address j=j₀ is first estimated where the absolute value of the complex data Aj existing in the neighborhood of spectrum corresponding to the frequency of the interference fringes becomes the maximum. The second power of the absolute value of Aj is equal to an inner product of the complex vector Aj on the complex plane and the same complex vector Aj, that is, S=(Aj, Aj). Next, using the complex data Aj₀ in the address j=j₀ where the absolute value of the complex data Aj becomes the maximum and the complex data Aj₀+1 and Aj₀−1 in both addresses adjacent to Aj, inner product values S0, S+, S− of the complex vectors shown in FIG. 5 are estimated. Among the inner product values S+, S− using both data adjacent to the maximum value, the one having the larger absolute value is made S1. Using the above-mentioned four values, i.e., S0, S+, S−, S1, Δ' and Δ" shown in FIG. 5 are estimated. Δ' is estimated in accordance with the method where from two data, that is, the maximum value and larger value of both values adjacent to this, the position becoming the true maximum is interpolated, and Δ" is estimated in accordance with the method where from three data, that is, the maximum value and both values adjacent to this, the position becoming the true maximum is interpolated.

Figure 6:
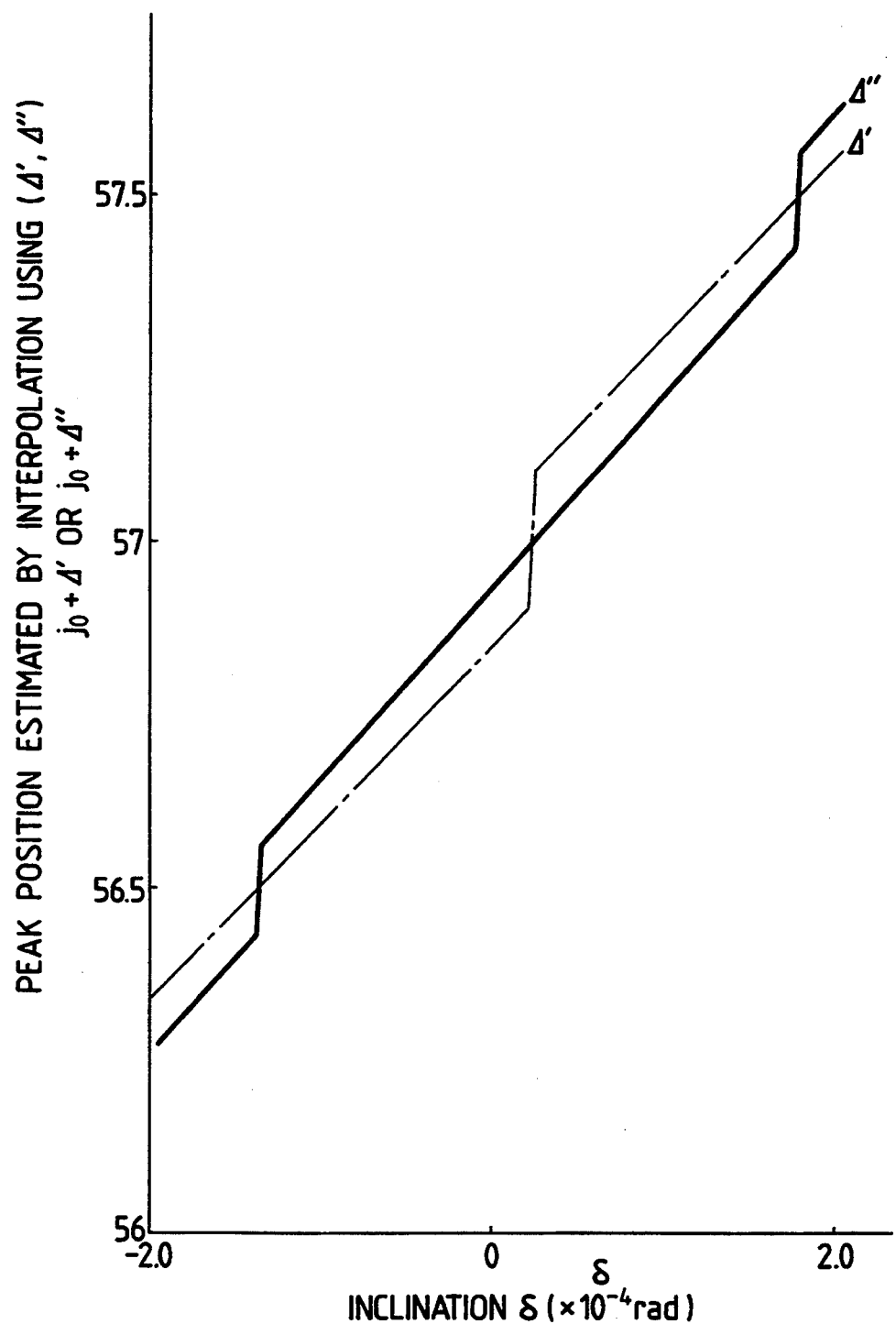
FIG. 6 shows a graph of $\Delta'$, $\Delta''$ with respect to inclination of a wafer using a signal with an envelope in Gaussian distribution when interference fringes are detected by a CCD unit in an embodiment of the invention.

FIG. 6 indicates the above-mentioned values of Δ', Δ" in a graph when the wafer is inclined, using signals with an envelope in Gaussian distribution when the above-mentioned interference fringes are detected in the CCD using the laser beam with the intensity in Gaussian distribution. In this case, as an example, the signal intensity distribution I(j) of interference fringes detected by an element in j-th address of the CCD to the inclination δ expressed by following formula (1) is assumed, where b, c, d, e, w, $\alpha_0$ are constants for determining the detection waveform.

In the optical system of FIG. 1, the detection light 16', which is twice reflected by the wafer 4, and the reference light 17' overlap each other to form interference fringes on the area A. These interference fringes extend in the vertical direction in FIG. 1 and the longitudinal direction thereof extend in the direction perpendicular to the sheet of FIG. 1. The pitch of the interference fringes $P_I$ which extend in the vertical direction in FIG. 1, is described as follows using the angles $\theta_0$, $\theta_1$ as shown in FIG. 1 and a wavelength λ:

$$P_I = \frac{\lambda}{\cos\theta_0 + \cos\theta_1} \quad (A)$$

When the wafer 4 is inclined by the angle of δ from the horizontal surface along with a line LL' as shown in FIG. 1, the angle $\theta_1$ of the detection light 16' after twice reflection by the wafer becomes $\theta_1 - 4\delta$.

Since δ is much smaller than $\theta_1$;($<<\theta_1$), $\theta_0$ is almost equal to $\theta_1$;($\theta_0 = \theta_1$) then $P_I$ is rewritten as follows:

$$P_I \approx \frac{\lambda}{2\cos\theta_0 + 4\delta} \quad (A')$$

The image of the interference fringes on the area A in FIG. 1 is focused on the surface of the CCD unit 3 with an enlarged image in accordance with the amplitude of M by the lenses 21 and 22. Therefore, the relationship between pitch $P_I$ and the pitch P of the interference fringes expressed by the unit of the distance between the adjacent elements of the CCD unit 3; $P_{CCD}$ is written as follows:

$$M \cdot P_I = P_{CCD} \cdot P \quad (B)$$

Then, from the formula (A') and (B), the pitch is written as follows:

$$P = \frac{M}{P_{CCD}} \cdot \frac{\lambda}{2\cos\theta_0 + 4\delta} \quad (C)$$

where $\alpha_0$ is written as follows:

$$\alpha_0 = 2\pi \frac{P_{CCD}}{M} \quad (D)$$

Then, I(j) is written as follows:

$$I(j) = \exp\left(-\frac{(c-j)^2}{W^2}\right)\left\{1 + b \cdot \cos\left(\frac{2\cos\theta_0 + 4\delta}{\lambda} \cdot \alpha_0 \cdot j\right) + d \cdot \sin(e \cdot j)\right\} \quad (1)$$

The signals of Δ', Δ" are substantially obtained not only for a waveform having an envelope in Gaussian distribution, but also for a waveform having an envelope in a lower frequency than the fundamental frequency of the interference fringes. Δ' in FIG. 5 produces the discontinuous abrupt step difference in the vicinity of the real or true spectrum peak position $j_R$ which is close to the $j_0$-th address providing the maximum value in the neighborhood of the spectrum position corresponding to the fundamental frequency, that is, in the vicinity of the position of =0. Consequently, using weighting functions $G_1(\Delta')$ and $G_2(\Delta'')$ indicated in the following formula (2) and formula (3) so that regarding Δ', the weighting becomes smaller as Δ' is close to 0, and regarding Δ" the weighting becomes smaller as the absolute value of Δ" is close to 0.5. Furthermore, Δ is estimated by following formula (4).

$$G_1(\Delta') = \Delta'^n \quad (2)$$
$$G_2(\Delta'') = (0.5 - |\Delta''|)^n \quad (3)$$

$$\Delta = \frac{\Delta' \times G_1(\Delta') + \Delta'' \times G_2(\Delta'')}{G_1(\Delta') + G_2(\Delta'')} \quad (4)$$

Figure 7:
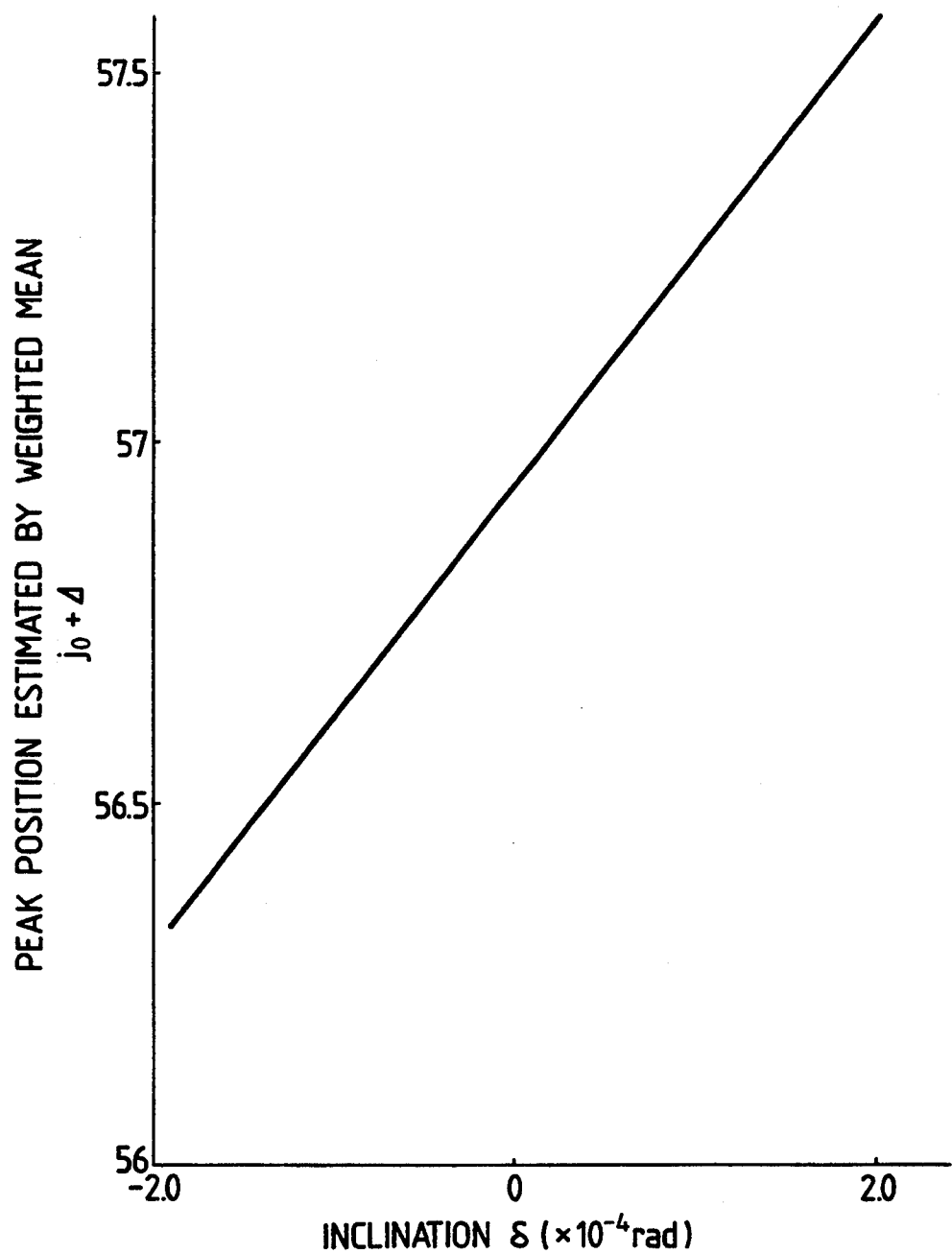
FIG. 7 shows a graph of $\delta$ estimated by formula (4) in using $\Delta'$, $\Delta''$ in FIG. 6 and adopting $n=2$ in formula (2) and formula (3) in accordance with the present invention.

FIG. 7 indicates a estimated by formula (4) in a graph, when Δ', Δ" in FIG. 6 obtained for the detection waveform of formula (1) are used, and n=2 is adopted in formula (3). It is seen that Δ obtained in FIG. 7 has sufficient linearity to be possessed originally in comparison to the interpolation values Δ', Δ" of the pitch. That is, by adopting the weighted mean of Δ', Δ" as above described, the inclination amount can be detected linearly and correctly.

The inclination δ of the wafer is calculated using the function Δ as defined as above and P as defined in FIG. 5 and the formula (C) and wherein $j_R = j_0 + \Delta$:

$$\delta = \frac{M \cdot \lambda \cdot (j_0 + \Delta)}{4 P_{CCD} \cdot N} - \frac{1}{2}\cos\theta_0$$

Figure 8:
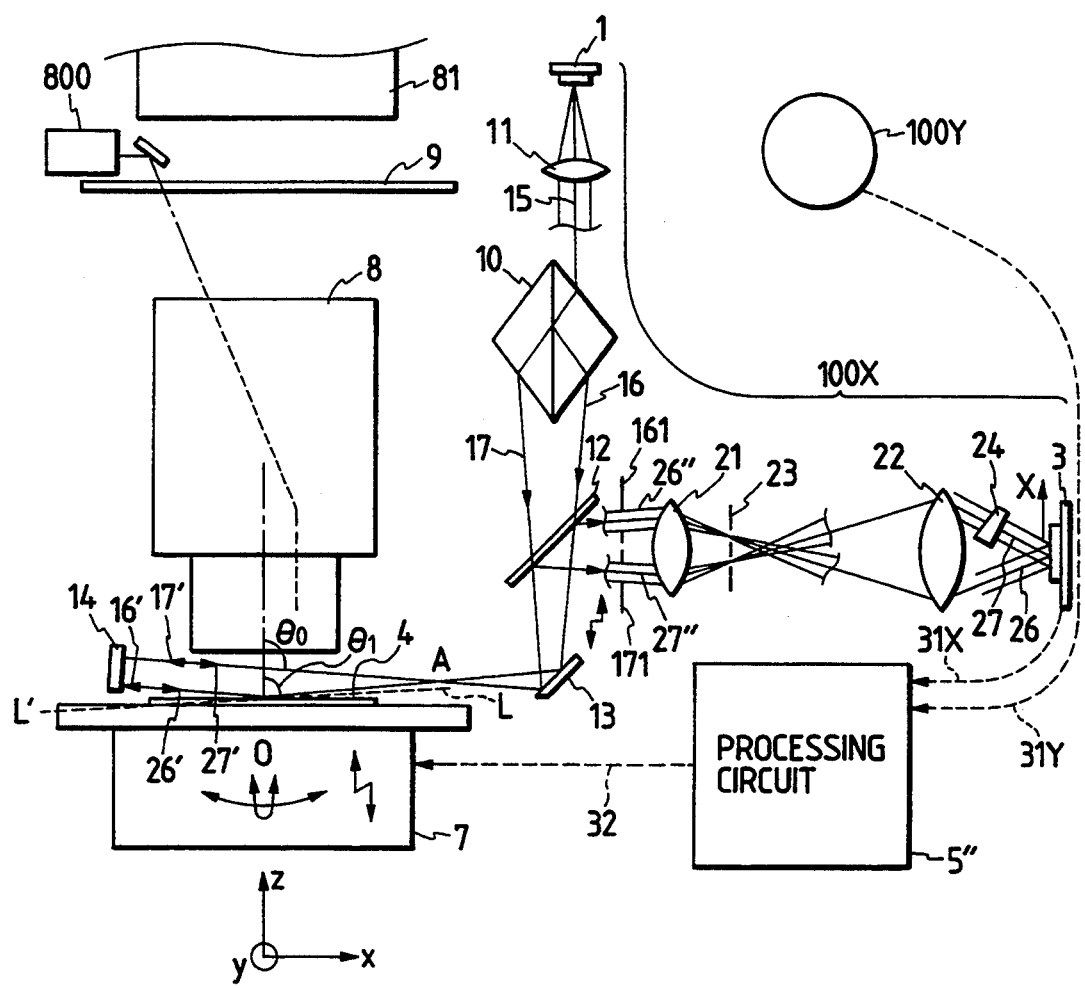
FIG. 8 is a block diagram showing a projection exposure device where shutters are arranged in a reference optical path and an object optical path in accordance with the invention.
Figure 9:
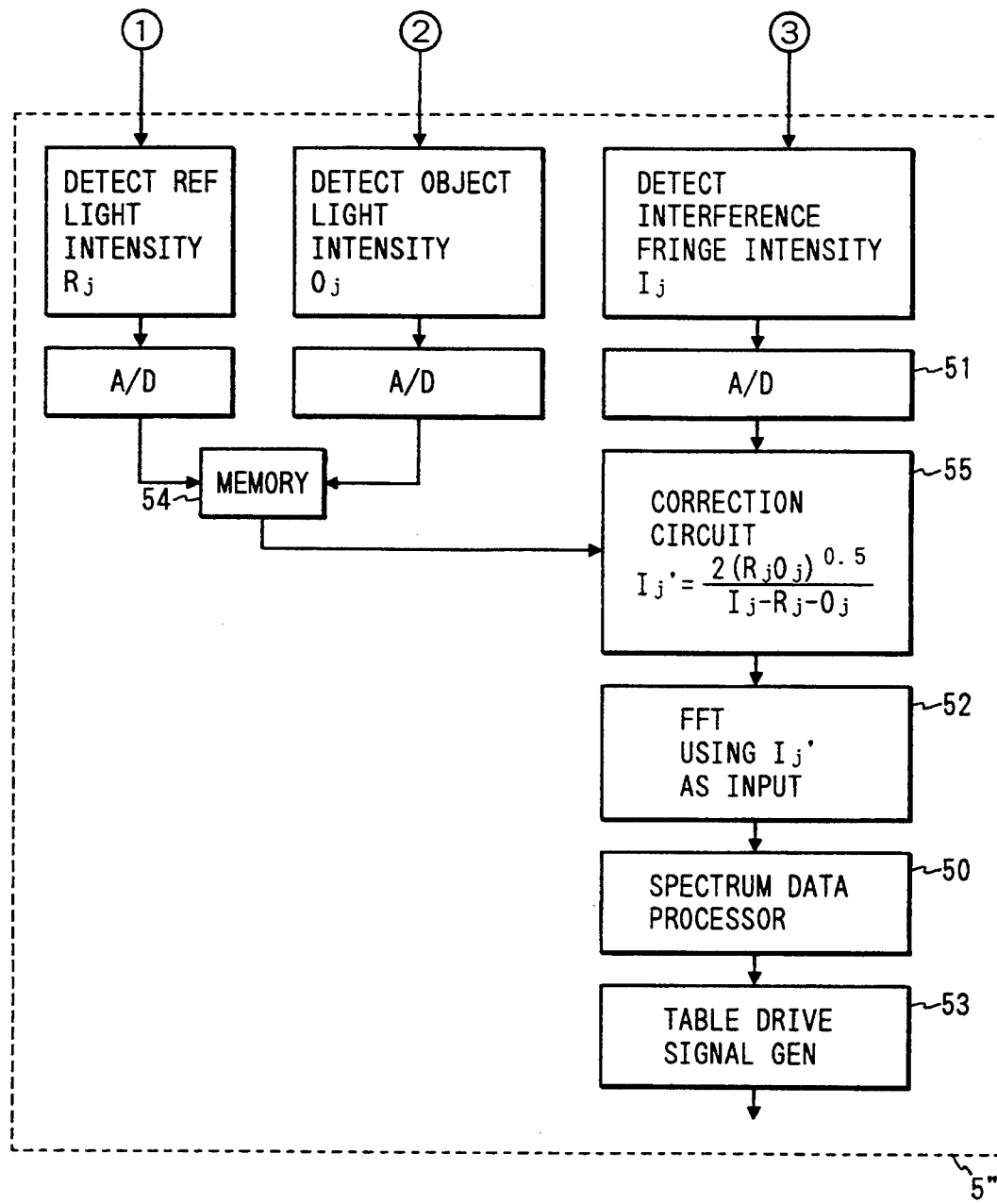
FIG. 9 is a block diagram of a processing circuit used in the embodiment of FIG. 8.

In the described embodiment, although n=2 is used in the weighting functions of formula (2) and formula (3), even when a n of 3 or 4 which is other than 2 or a number not being an integer is used, a sufficient effect can be obtained. Also the weighting function is not limited to the above-mentioned formula (2) or formula (3). FIG. 8 shows an embodiment of the present invention wherein the same numerals as those in FIG. 1 designate the same parts. In a projection exposure device of FIG. 8, shutters 171 and 161 are arranged in the reference optical path and the objective optical path (wafer illumination optical path). These shutters can perform the ON/OFF operation of a reference light and/or an object light. In place of the processing circuit 5' in FIG. 1, a processing circuit 5" as shown in FIG. 9 is used. First, processing as shown in ①  is performed. That is, the shutter 161 is closed, and the light intensity distribution R of the reference light 17 only is detected. The signal 31RX is converted to digital information by an A/D converter as shown in FIG. 9, and is stored in a memory circuit 54. Next, processing shown in ② is performed. That is, the shutter 171 is closed, and the light intensity distribution O of the object light (wafer irradiation light) only is detected. This signal 310X is also subjected to A/D conversion and then stored in the memory circuit 54. Storage of the intensity distribution of these two lights is performed before the exposure process. In the exposure to the wafer, as shown in ③ of FIG. 9, both shutters are opened and the interference fringes due to the reference light and the reflected object light from the wafer are detected in similar manner to the embodiment in FIG. 1, and the electric signal 311X of the intensity I is subjected to A/D conversion by the A/D converter 51, and following operation is performed in a correction arithmetic circuit 55 and the correction interference fringes intensity I' is estimated by following formula (5).

$$I' = \frac{2(RO)^{0.5}}{I - R - O} \quad (5)$$

Using the intensity I', fast Fourier transformation is performed in the FFT circuit 52 as explained using FIG. 4 in the embodiment of FIG. 1, and the operation of estimating pitch in accordance with FIG. 5 is performed by a spectral data processing circuit 50, and the pitch P of the interference fringes is estimated correctly. Since a substantially linear relation exists between the pitch and the inclination of the wafer, a wafer stage or table 7 is driven by a table drive signal generating circuit 53 so as to attain the pitch $P_0$ corresponding to the aimed inclination, and the inclination correction is performed. The height of the wafer is estimated from phase $\Phi$ of the spectral peak corresponding to the interference frequency of FFT (value estimating arctangent (imaginary/real) from the imaginary number and the real number of the complex data), and the wafer table 7 is driven and the height is corrected so as to attain the phase value $\Phi_0$ corresponding to the described height, thereby the exposure can be performed in the state that the wafer surface is brought to the best focus plane.

In the embodiment of FIG. 8, although the intensity distribution of both the reference light and the reflected light from the wafer is estimated and correction is performed, even when the correction is performed using the intensity distribution of only the reference light or the reflected light from the wafer, the correct inclination detection can be performed. As a result, the exposure to the wafer becomes possible.

Figure 10:
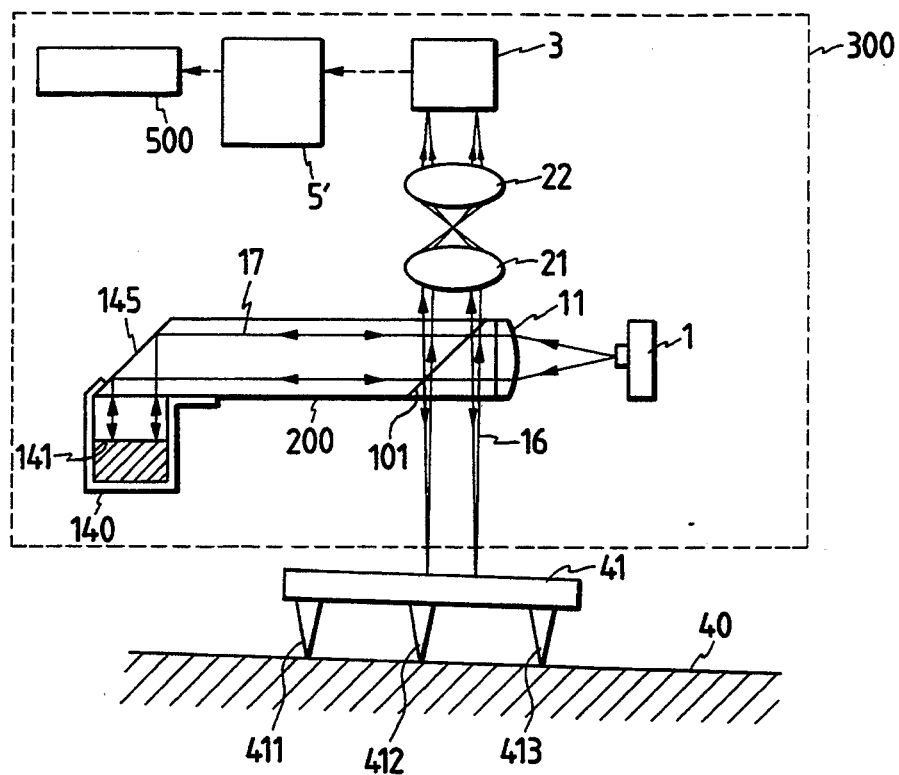
FIG. 10 is a block diagram of an embodiment of the invention where the detection of inclination is applied to a level.

FIG. 10 shows an example where the method of detecting inclination according to the present invention is applied to a level. The level body is constituted by a part 300 shown in dotted line. A laser light source emits laser light which is made a plane wave which is substantially parallel by a collimator system 11. The plane wave is separated into a reference light 17 and an object light 16 by a beam splitter 101 in an interference optical system 200. The reference light 17 is reflected in total reflection by a reflecting plane 145, and then reflected by a liquid surface 141 of a horizontal reference vessel 140. The reflected light travels again on the originally followed optical path reversely, and is reflected by the beam splitter 101 and passes through lenses 21, 22 and reaches an interference fringe detector 3. On the other hand, the object light 16 reflected by the beam splitter 101 is incident to a measuring jig 41 installed on a measured surface 40, and the reflected light travels again on the original optical path reversely. The upper surface of the measuring jig 41 is a plane which is ground optically, and three legs 411, 412, 413 are attached to the lower surface of the jig 41 and the plane including the three top ends at a lower side of these legs and the plane of the upper surface of the jig 41 are held in parallel with high accuracy. The light reflected by the measuring jig 41 passes through the beam splitter 101 and the lenses 21, 22, and then overlaps the reference light on the interference fringe detector 3 and generates the interference fringes. The reflecting plane 141 and the reflecting plane of the beam splitter 101 is not at 45° with respect to the horizontal surface, but is shifted by several degrees of a constant value from the inclination. As a result, the fringe signal is detected as fringes having substantially constant pitch by the interference fringe detector when the measured surface is nearly horizontal. Since distribution of the original laser light is in a Gaussian distribution and considerable vibration exists during the measurement, the fringe signal is not constituted by fringes of one frequency component only, but the fringe signal has one frequency component as the main component and exists as a sharp spectral component and the spectrum has a slight spread. Therefore, if the correct center position of the spectrum, i.e., the true spectral peak position is estimated using the processing circuit 5' for detecting inclination of the present invention as already described using FIGS. 4 and 5, the inclination from the horizontal plane can be detected exactly. The detected value is indicated in an indicator 500.

Figure 11:
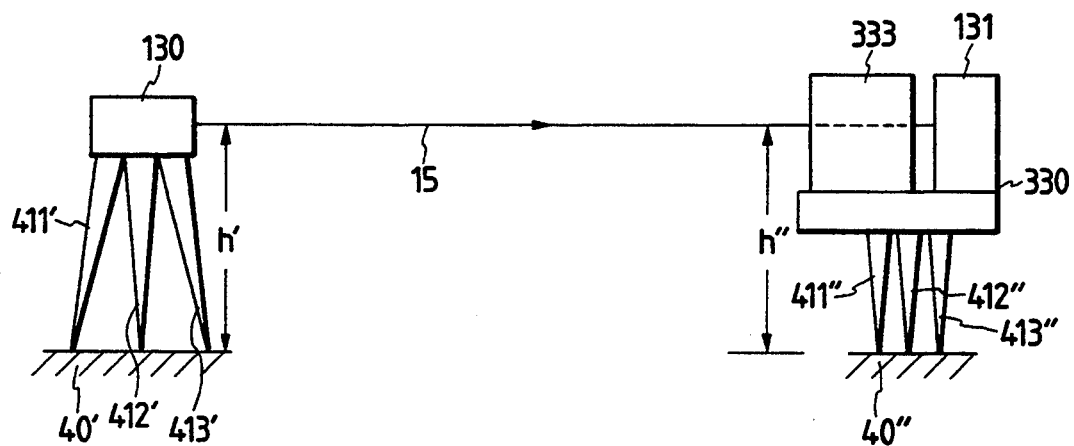
FIG. 11 is a block diagram of an embodiment of the invention where the detection of inclination is applied to a surveying device.
Figure 12:
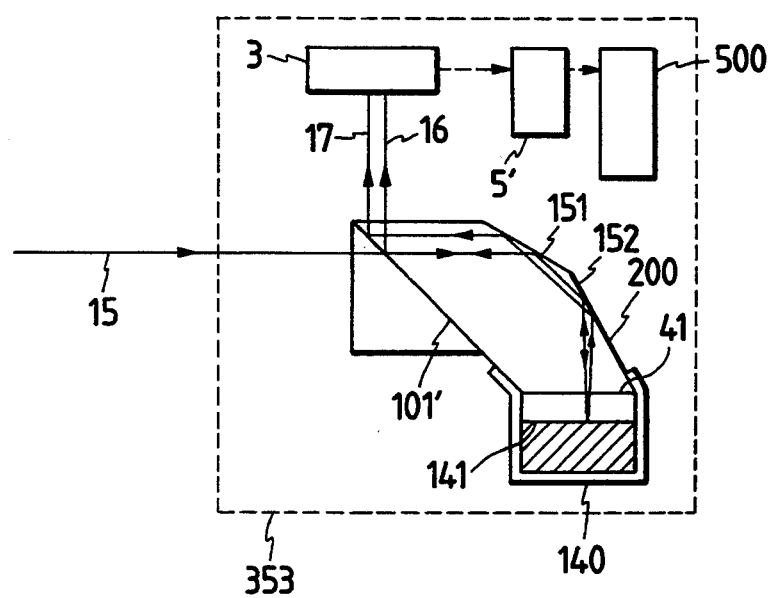
FIG. 12 is a block diagram of an inclination detector for the embodiment of FIG. 11.

FIGS. 11 and 12 show an example where the method of detecting inclination according to the present invention is applied to a surveying device. The surveying is carried out regarding whether the planes 40' and 40" which are at spaced positions exist on the same level or not, or regarding which plane is higher. A projector 130 containing a laser light source on the plane 40' is supported on three legs 411', 412' and 413'. The laser light projected from the projector 130 is at height h' from the plane 40'. A detector 330 is provided above the plane 40", and first measures height h" of the projected beam from the plane 40" by a height detector 131. The height detector 131 comprises a light position detector for detecting the position of light, and a position detector capable of exactly detecting the moving amount of the light position detector which is moved in the vertical direction. When the height of the beam is measured by the height detector, an inclination detector 333 is detached or put on a roundabout route, thereby the height h" is measured by the height detector 131. Next, using an inclination detector which is shown in FIG. 12 in detail, the inclination of the laser beam, i.e., the inclination of the laser beam from the horizontal plane is measured. In the measurement, the laser beam itself which is used in the height measurement is used for the height measurement. The laser beam being incident to the inclination detector 333 passes through the beam splitter 101' of the interference optical system 10, and is reflected in total reflection by planes 151 and 152. A part of the reflected light is reflected by a prism end surface 41, and travels on the original optical path reversely. Since both lights which are reflected and returned by 41 and 141 are reflected by the beam splitter 101' and form the interference fringes on the detector 3, the fringes are detected and sent to the processing circuit 5'. In the processing circuit 5', as described in the above embodiment, the inclination $\Delta\theta$ from the horizontal plane is detected. If the three legs of each of the projector and the detector are adjusted so that h'=h", $\Delta\theta$ represents the inclination of the plane 40' and the plane 40" from the horizontal plane. Also if the distance L between the projector 130 and the detector 131 is known, the inclination of the plane 40' and the plane 40" from the horizontal plane can be estimated from $(h"-h')/L+\Delta\theta$ even if h'=h".

According to the present invention, by utilizing interference of the laser, the inclination of a measured surface can be measured without being influenced by the measuring conditions at high accuracy of 1-10 rad and at high speed. For example, if the FFT exclusive circuit is used, the variation of the inclination can be detected each time within 1-several ms. Also accompanying with such technical effects, many effects are provided in preventing the yield of the exposure process in the semiconductor manufacturing from being deteriorated with the further miniaturization of the circuit pattern in the future.

While we have shown and described several embodiments in accordance with the present invention, it is understood that the same is not limited thereto but is susceptible of numerous changes and modifications as known to those skilled in the art and we therefore do not wish to be limited to the details shown and described herein but intend to cover all such changes and modifications as are encompassed by the scope of the appended claims.

What is claimed is:

1. A projection exposure apparatus having an illumination light source for exposure, an illumination optical system for irradiating an exposure light emitted from said light source into a mask or a reticle, and a projection optical system for projecting a light transmitted through the mask or the reticle into an object to be exposed, said apparatus comprising:
- a coherent light source for emitting coherent light;
- a beam splitter for dividing the coherent light emitted from said coherent light source into first and second lights;
- an inclination detecting illumination system for obliquely irradiating the first coherent light separated by said beam splitter to an object to be exposed;
- image pickup means for detecting a detection light obtained by the first coherent light reflected by the object to be exposed;
- an interference detecting system using the second coherent light separated by said beam splitter as a reference light, said detection light and said reference light overlapping each other on said image pickup means to form interference fringes;
- processing circuit means for processing a periodically varying coherent signal obtained by said image pickup means, said processing circuit means including Fourier transformation means for discretely Fourier transforming the detected signal of the interference fringes into spectrum data; means for calculating a true spectrum peak position $j_R$ in accordance with a relationship $j_R = j_0 + \Delta$, where $j_0$ is a detected spectrum peak position and $\Delta$ is a correcting value estimated from the Fourier transformed spectrum data adjacent to $j_0$, and means for calculating the period P of the signal in accordance with a relationship $P = N/j_R$, where N is the number of sample data points for the Fourier transformation.

2. A projection exposure apparatus according to claim 1, wherein said processing circuit means further includes means for calculating the inclination $\delta$ of the specimen from the period P.

3. A projection exposure apparatus according to claim 1, wherein said processing circuit means includes means for calculating a height of the specimen from phase data obtained from a real number and an imaginary number of the complex data in the sampling point to provide the maximum value in sampling points in the vicinity of the spectrum corresponding to the interference fringes.

4. A projection exposure apparatus according to claim 1, further comprising means for moving the specimen in accordance with the calculated inclination thereof.

5. A projection exposure apparatus according to claim 1, wherein the means for calculating the true spectrum peak position.

6. A projection exposure apparatus according to claim 2, wherein means for calculating the true spectrum peak position $j_R$ includes means for utilizing at least one of $\Delta'$ and $\Delta''$, where $\Delta'$ is a correcting value of the spectrum peak position obtained from the spectrum data of three points of the detected spectrum peak position $j_0$ and adjacent detecting positions $j_0-1$ and $j_0+1$, and $\Delta''$ is a correcting value of the spectrum peak position obtained from the $\Delta'$ and the maximum and the next minimum spectrum data of the three points of $j_0-1$, $j_0$ and $j_0+1$.

7. A projection exposure apparatus according to claim 6, wherein the means for calculating the true spectrum peak position $j_R$ includes:
- means calculating an interpolation spectrum peak position $j_0 + \Delta'$ ($|\Delta'| \leq 0.5$) obtained from the spectrum data of the three points $j_0$, $j_0-1$ and $j_0+1$ to $j_0$;
- means calculating an interpolation spectral peak position $j_0 \Delta''$ $|\Delta''| \leq 0.5$) from the spectrum data having the maximum value and the largest value of the next spectrum data thereto among the three points; and
- means calculating the true spectrum peak position $j_0 + \Delta$ $|\Delta| \leq 0.5$) using $\Delta'$ and $\Delta''$.

8. A projection exposure apparatus according to claim 7, where $\Delta'$ is subjected to a weighting of $G_1(\Delta')$ as function of $\Delta'$, and $\Delta''$ is subjected to a weighting of $G_2(\Delta'')$ as a function of $\Delta''$, and the means for calculating the inclination of the specimen is a weighted mean $\Delta$, wherein $\Delta = (\Delta' \times G_1(\Delta') + \Delta'' \times G_2(\Delta'')/G_1(\Delta') + G_2(\Delta'')$.

9. A method of detecting inclination of a specimen comprising the steps of:
- dividing coherent light into first and second lights;
- irradiating the first light onto a specimen at a predetermined angle;
- interfering a reflected light from the specimen and a reference light as the second light with each other so as to form interference fringes;
- detecting the interference fringes including detecting a spectrum of a signal intensity obtained from the detected interference fringes;
- subjecting the detected spectrum data to a fast complex Fourier transformation;
- determining a true spectrum position $j_R$ in accordance with a relationship $j_R = j_0 + \Delta$, where $j_0$ is a detected spectrum peak position and $\Delta$ is a correcting value estimated from the Fourier transformed spectrum data adjacent to $j_0$;
- determining the pitch P of the period of the signal intensity information in accordance with a relationship $P = N/j_R$, where N is the number of sample data points for the complex Fourier transformation; and
- determining the inclination of the specimen from the pitch P representing the period of the interference fringes formed by the reflected light and the reference light.

* * * * *